United States Patent
Dellas et al.

(10) Patent No.: US 9,741,557 B1
(45) Date of Patent: Aug. 22, 2017

(54) SILICON NITRIDE PROCESS FOR REDUCTION OF THRESHOLD SHIFT

(71) Applicant: Texas Instruments Incorporated, Dallas, TX (US)

(72) Inventors: Nicholas Stephen Dellas, Dallas, TX (US); Naveen Tipirneni, Plano, TX (US); Dong Seup Lee, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/191,500

(22) Filed: Jun. 23, 2016

(51) Int. Cl.
| | |
|---|---|
| *H01L 29/02* | (2006.01) |
| *H01L 21/02* | (2006.01) |
| *H01L 29/20* | (2006.01) |
| *H01L 29/786* | (2006.01) |
| *H01L 29/66* | (2006.01) |

(52) U.S. Cl.
CPC ...... *H01L 21/0228* (2013.01); *H01L 21/0217* (2013.01); *H01L 21/0254* (2013.01); *H01L 29/2003* (2013.01); *H01L 29/66522* (2013.01); *H01L 29/78606* (2013.01)

(58) Field of Classification Search
CPC ............ H01L 21/0228; H01L 21/0254; H01L 29/2003; H01L 29/78606; H01L 29/66522; H01L 21/0217
See application file for complete search history.

(56) References Cited

U.S. PATENT DOCUMENTS

| | | | | |
|---|---|---|---|---|
| 5,972,804 A | * | 10/1999 | Tobin | H01L 21/28202 257/E21.433 |
| 6,787,863 B2 | * | 9/2004 | Nakajima | H01L 21/28185 257/301 |
| 8,354,312 B2 | * | 1/2013 | Komatani | H01L 21/28264 257/E21.403 |
| 2005/0159017 A1 | * | 7/2005 | Kim | C23C 16/345 438/791 |
| 2008/0203541 A1 | * | 8/2008 | Makiyama | C23C 16/345 257/640 |
| 2014/0054725 A1 | * | 2/2014 | Chang | H01L 29/78 257/411 |
| 2015/0145004 A1 | * | 5/2015 | Inoue | H01L 29/4236 257/192 |

* cited by examiner

*Primary Examiner* — Yosef Gebreyesus
(74) *Attorney, Agent, or Firm* — Tuenlap D. Chan; Charles A. Brill; Frank D. Cimino

(57) ABSTRACT

A semiconductor device has a substrate with a semiconductor material. The semiconductor device includes a field effect transistor in and on the semiconductor material. The field effect transistor has a gate dielectric layer over the semiconductor material of the semiconductor device, and a gate over the gate dielectric layer. The gate dielectric layer includes a layer of nitrogen-rich silicon nitride immediately over the region for the channel, and under the gate.

16 Claims, 4 Drawing Sheets

SILICON NITRIDE PROCESS FOR REDUCTION OF THRESHOLD SHIFT

FIELD

This disclosure relates to the field of semiconductor devices. More particularly, this disclosure relates to field effect transistors in semiconductor devices.

BACKGROUND

A field effect transistor (FET) operates by applying a potential to the gate of the transistor, which changes the density of charge carriers in the channel of the transistor. The threshold potential of the transistor may be understood as the gate potential at which the transistor changes from the off state, in which minimal current flows through the channel, to the on state, in which a pre-defined current flows through the channel. Reliable operation of the transistor depends on the threshold potential remaining constant during the operational lifetime of the transistor. Charges tend to accumulate between the gate and the channel, in the gate dielectric layer, and thus adversely affect the reliability by shifting the threshold potential. Charge accumulation is particularly problematic in gate dielectric layers which include silicon nitride.

SUMMARY OF THE DISCLOSURE

The following presents a simplified summary in order to provide a basic understanding of one or more aspects of the disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

A semiconductor device includes a FET with a gate dielectric layer over a semiconductor region of the semiconductor device, and a gate over the gate dielectric layer. The gate dielectric layer includes a layer of nitrogen-rich silicon nitride immediately over the semiconductor region, and under the gate.

DETAILED DESCRIPTION OF EXAMPLE EMBODIMENTS

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. One skilled in the relevant art, however, will readily recognize that the disclosure can be practiced without one or more of the specific details or with other methods. In other instances, well-known structures or operations are not shown in detail to avoid obscuring the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

A semiconductor device includes a FET with a gate dielectric layer over a region for a channel in a semiconductor region of the semiconductor device, and a gate over the gate dielectric layer. The channel is an inversion layer in the semiconductor region under the gate. If the FET is an enhancement mode device, the channel generally does not exist when the semiconductor device is unpowered and not being operated. If the FET is a depletion mode device, the channel generally exists when the semiconductor device is unpowered and not being operated. For the purpose of improving the readability of this disclosure, the region for the channel will hereinafter be referred to as the channel, even in cases in which the semiconductor device is unpowered and not being operated. It is understood that the channel may exist for the particular semiconductor device being disclosed only when the semiconductor device is being operated.

The channel may be developed in a group III-V semiconductor material such as gallium nitride or an alloy semiconductor material of gallium nitride and aluminum nitride. The gate dielectric layer includes a layer of nitrogen-rich silicon nitride that is positioned immediately over the channel, and under the gate. The gate dielectric layer may also include a layer of silicon-rich silicon nitride over the layer of nitrogen-rich silicon nitride, and the gate dielectric layer is positioned under the gate.

Figure 1:
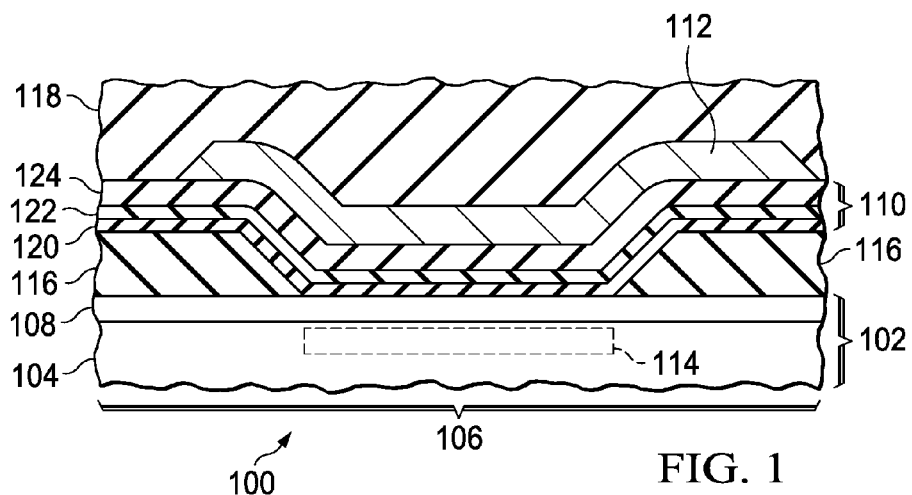
FIG. 1 is a cross section of an example semiconductor device.

FIG. 1 is a cross section of an example semiconductor device 100. The semiconductor device 100 is developed on a substrate 102 having a semiconductor region 104. The semiconductor device 100 includes a FET 106. The semiconductor region 104 may include group III-V semiconductor material such as gallium nitride or an alloy semiconductor material of gallium nitride and aluminum nitride. Other semiconductor materials, such as other group III-V semiconductors, group II-VI semiconductors or possibly Group IV semiconductors, are within the scope of the instant example. In versions of the instant example in which the semiconductor region 104 includes group III-V semiconductor material, an optional stressor layer 108 comprising one or more sub-layers of group III-V material may be formed over the semiconductor region 104. The stressor layer 108 may be used for inducing piezoelectric stress in the semiconductor region 104, and potentially for other purposes, such as providing isolation between a two-dimensional electron gas in the semiconductor region 104 and a gate 112. The optional stressor layer 108, if present, may be a part of the substrate 102. Similarly, any native oxide layers on the substrate 102, if present, may be developed onto the substrate 102.

The FET 106 may be a depletion mode device or an enhancement mode device. The FET 106 includes a gate dielectric layer 110 disposed over the substrate 102. The gate 112 is disposed over the gate dielectric layer 110. A channel 114 is located in the semiconductor region 104 under the gate dielectric layer 110. An isolation dielectric layer 116 may be disposed over the substrate 102 outside of the channel 114; lateral boundaries of the isolation dielectric layer 116 may define a lateral area for the channel 114. The gate dielectric layer 110 and the gate 112 may extend partway over the isolation dielectric layer 116, further on a drain side than on a source side, as depicted in FIG. 1, to serve as a field plate adjacent to the channel 114. An interconnect dielectric layer 118 may be disposed over the gate 112 to isolate the gate 112 from other interconnects of the semiconductor device 100 such as source and drain contacts.

In the instant example, the gate dielectric layer 110 includes a nitrogen-rich layer of silicon nitride 120, hereinafter referred to as the N-rich layer 120 disposed immediately over the substrate 102 in the area over the channel 114. A silicon-to-nitrogen atomic ratio of a silicon nitride layer may be characterized by an index of refraction. The index of refraction may be measured at a wavelength of 630 nanometers to 635 nanometers. Stoichiometric silicon nitride may have a silicon-to-nitrogen atomic ratio of about, 0.75, for example within a margin of less than 1 percent. The N-rich layer 120 may have an index of refraction that is 0.015 to 0.030 less than an index of refraction of stoichiometric silicon nitride material. Such an N-rich layer 120 has been shown to be an effective for reducing charge accumulation. The N-rich layer 120 may be 5 nanometers to 20 nanometers thick, which has been shown to be an effective thickness for reducing charge accumulation. A hydrogen content, expressed in atomic fraction, of the N-rich layer 120 may be less than 10 percent, which may advantageously further reduce charge accumulation.

The gate dielectric layer 110 may further include an optional silicon rich layer of silicon nitride 122, hereinafter referred to as the Si-rich layer 122, disposed over the N-rich layer 120. The Si-rich layer 122 may have an index of refraction that is 0.025 to 0.040 more than the index of refraction of the stoichiometric silicon nitride material. The Si-rich layer 122 may be 5 nanometers to 20 nanometers thick, which has been shown to be an effective thickness for further reducing charge accumulation when disposed over the N-rich layer 120. A hydrogen content of the Si-rich layer 122 may also be less than 10 percent.

The gate dielectric layer 110 may further include an optional threshold adjust dielectric layer 124 disposed over the N-rich layer 120 and over the Si-rich layer 122 if present, to provide a desired threshold potential for the FET 106. The threshold adjust dielectric layer 124 may include stoichiometric silicon nitride, or silicon dioxide, or other dielectric material.

The FET 106 includes source and drain regions (not shown in FIG. 1) that are positioned on opposite ends of the channel 114. The semiconductor device 100 includes interconnects such as metal contacts and metal lines through the interconnect dielectric layer 118 to provide electrical connections to the gate 112 and the source and drain regions.

Figure 2A:
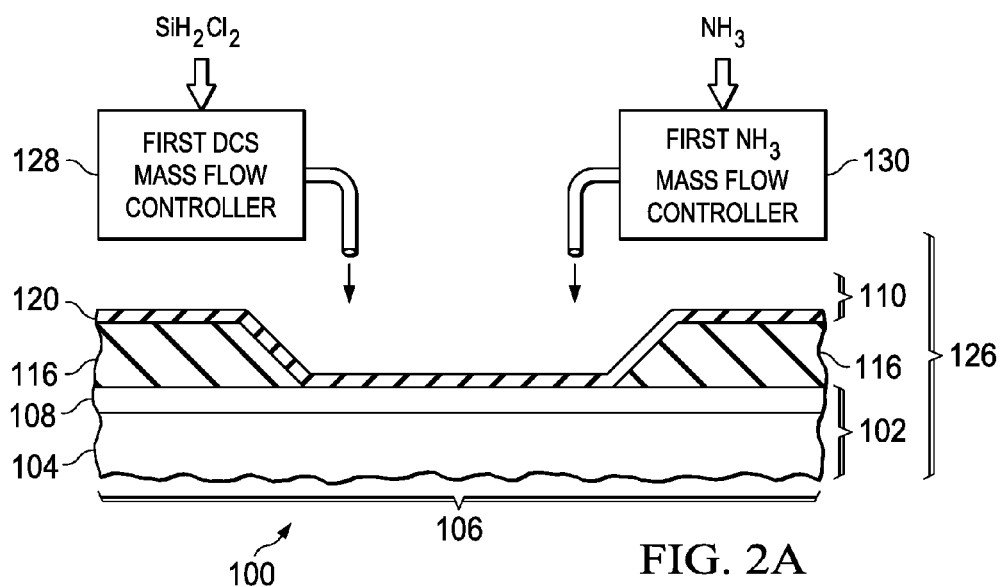
FIG. 2A through FIG. 2E are cross sections of the semiconductor device of FIG. 1, depicting stages of an exemplary method of formation.

FIG. 2A through FIG. 2E are cross sections of the semiconductor device of FIG. 1, depicting stages of an exemplary method of formation. Referring to FIG. 2A, the isolation dielectric layer 116 is formed over the substrate 102 prior to forming the gate dielectric layer 110. The isolation dielectric layer 116 may be formed, for example, by forming a layer of silicon dioxide over the substrate 102, then forming an isolation mask over the layer of silicon dioxide which exposes the layer of silicon dioxide in the area for the channel 114 of FIG. 1. The layer of silicon dioxide is etched in the area exposed by the isolation mask, and the isolation mask is subsequently removed.

The semiconductor device 100 is placed in a first low pressure chemical vapor deposition (LPCVD) chamber 126, possibly with a plurality of similar substrates. The semiconductor device 100 is heated to a temperature of 600° C. to 740° C. Dichlorosilane is flowed into the first LPCVD chamber 126 at a flow rate of 10 standard cubic centimeters per minute (sccm) to 80 sccm, using a first dichlorosilane (DCS) flow controller 128. Ammonia is flowed into the first LPCVD chamber 126 at a flow rate of 6 to 12 times the flow rate of the dichlorosilane, using a first ammonia ($NH_3$) flow controller 130. A pressure in the first LPCVD chamber 126 is maintained at 100 millitorr to 500 millitorr. The flow rates of the dichlorosilane and the ammonia disclosed in the instant example apply to 200 millimeter substrates run in a batch of 60 wafers to 150 wafers. The flow rates may be varied for other size substrates and batch loads, while the ratio of the dichlorosilane and ammonia flow rates is maintained. The dichlorosilane and the ammonia react on the semiconductor device 100 to form the N-rich layer 120. Flows of the dichlorosilane and the ammonia may be continued for a predetermined time to attain a desired thickness of the N-rich layer 120, after which the flows are discontinued. Alternatively, a thickness of the N-rich layer 120 may be monitored to determine an appropriate time to discontinue the flows. Other methods of process control for formation of the N-rich layer 120 are within the scope of the instant example. In one version of the instant example, the N-rich layer 120 may maintained in a low pressure ambient substantially free of oxidizing reagents such as oxygen or nitrous oxide in order to prevent oxidation of a top surface of the N-rich layer 120.

Figure 2B:
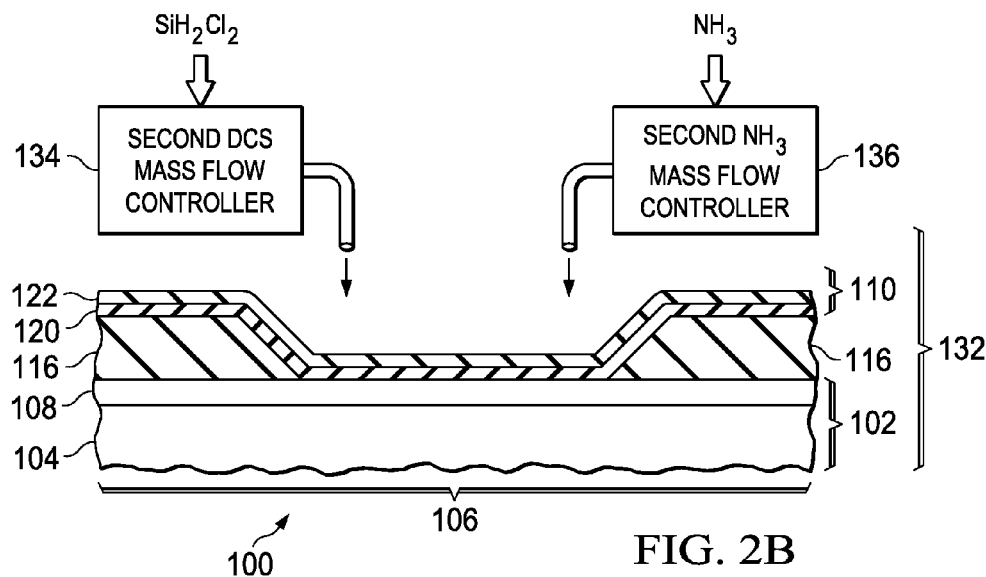

Referring to FIG. 2B, the semiconductor device 100 is placed in a second LPCVD chamber 132, which may be the first LPCVD chamber 126 of FIG. 2A. The semiconductor device 100 is heated to a temperature of 780° C. to 900° C. Dichlorosilane is flowed into the second LPCVD chamber 132 at a flow rate of 40 sccm to 100 sccm, using a second DCS flow controller 134, which may be the first DCS flow controller 128 of FIG. 2A. Ammonia is flowed into the second LPCVD chamber 132 at a flow rate of 3 to 6 times the flow rate of the dichlorosilane, using a second $NH_3$ flow controller 136, which may be the first $NH_3$ controller 130 of FIG. 2A. A pressure in the second LPCVD chamber 132 is maintained at 100 millitorr to 500 millitorr. The dichlorosilane and the ammonia react on the N-rich layer 120 to form the Si-rich layer 122. Flows of the dichlorosilane and the ammonia may be continued for a predetermined time or may be endpointed, as discussed in reference to FIG. 2A. In one version of the instant example, the Si-rich layer 122 may maintained in a low pressure ambient substantially free of any oxidizing reagent. Using the same LPCVD chamber 132 for forming the N-rich layer 120 and the Si-rich layer 122 may advantageously reduce process complexity for forming the semiconductor device 100.

Figure 2C:
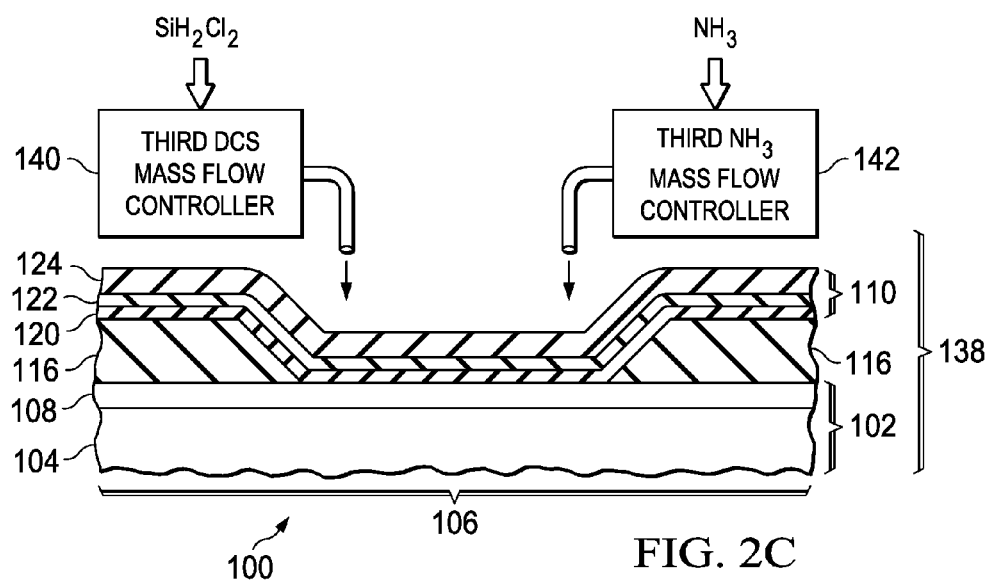

Referring to FIG. 2C, the semiconductor device 100 is placed in a third LPCVD chamber 138, which may be the first LPCVD chamber 126 of FIG. 2A and/or the second LPCVD chamber 132 of FIG. 2B. The semiconductor device 100 is heated to a temperature of 740° C. to 780° C. Dichlorosilane is flowed into the third LPCVD chamber 138 at a flow rate of 30 sccm to 120 sccm, using a third DCS flow controller 140, which may be the first DCS flow controller 128 of FIG. 2A and/or the second DCS flow controller 134 of FIG. 2B. Ammonia is flowed into the third LPCVD chamber 138 at a flow rate of 8 to 12 times the flow rate of the dichlorosilane, using a third $NH_3$ flow controller 142, which may be the first $NH_3$ controller 130 of FIG. 2A and/or the second NH₃ flow controller 136 of FIG. 2B. A pressure in the third LPCVD chamber 138 is maintained at 100 millitorr to 500 millitorr. The dichlorosilane and the ammonia react on the Si-rich layer 122 to form the stoichiometric silicon nitride layer 124. Flows of the dichlorosilane and the ammonia may be continued for a predetermined time or may be endpointed, as discussed in reference to FIG. 2A. Using the same LPCVD chamber 138 for forming the stoichiometric silicon nitride layer 124 and the N-rich layer 120 and the Si-rich layer 122 may advantageously further reduce process complexity for forming the semiconductor device 100.

Figure 2D:
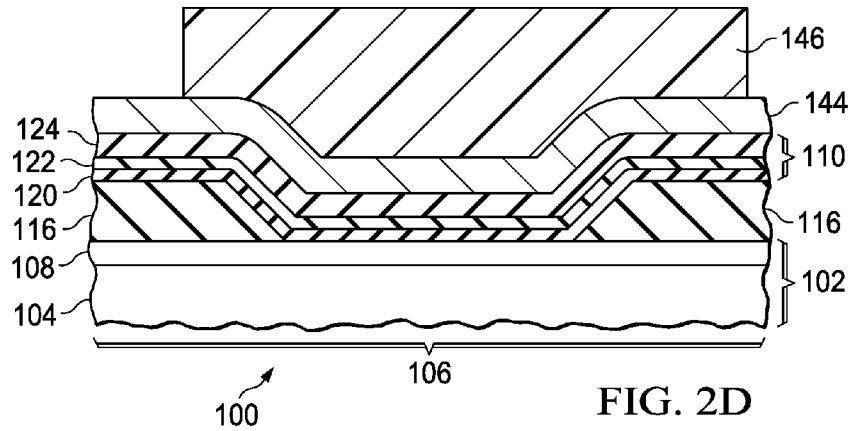

Referring to FIG. 2D, a layer of gate material 144 is formed over the gate dielectric layer 110. The layer of gate material 144 may include sub-layers of different metals, to provide adhesion, a desired work function and a desired sheet resistance, for example. The layer of gate material 144 may include, for example, titanium, titanium nitride, and aluminum. The layer of gate material 144 may be formed, for example, by a sputter process, an evaporation process, and/or an atomic layer deposition (ALD) process.

A gate mask 146 is formed over the layer of gate material 144 which covers an area for the gate 112 of FIG. 1. The gate mask 146 may extend partway over the isolation dielectric layer 116, as depicted in FIG. 2D, to provide the field plate functionality discussed in reference to FIG. 1. The gate mask 146 may include photoresist, formed by a photolithographic process, and may include anti-reflection material such as an organic bottom anti-reflection coat (BARC).

Figure 2E:
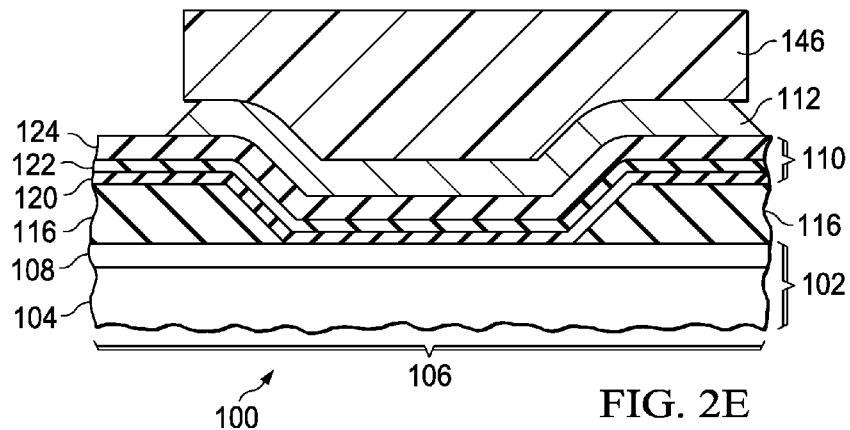

Referring to FIG. 2E, gate material of the layer of gate material 144 of FIG. 2D is removed where exposed by the gate mask 146, leaving the gate material under the gate mask 146 to form the gate 112. The gate material may be removed from the layer of gate material 144 by a wet etch process, producing sloped sides on the gate 112 as depicted in FIG. 2E. A wet etch process may have a desired etch selectivity to the gate dielectric layer 110. Alternatively, the gate material may be removed by a plasma etch process such as a reactive ion etch (RIE) process. The gate mask 146 is subsequently removed, for example by an asher process, followed by a wet clean process.

Figure 3:
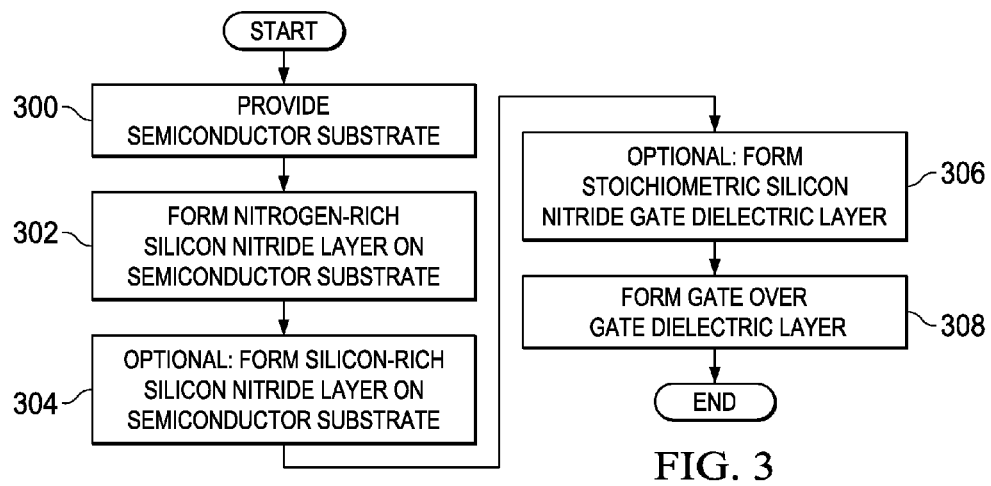
FIG. 3 is a flowchart of an example method for forming a semiconductor device including a FET.

FIG. 3 is a flowchart of an example method for forming a semiconductor device including a FET. Operation 300 is to provide a semiconductor substrate. The semiconductor substrate may be a wafer with multiple areas for similar semiconductor devices. The semiconductor substrate may include several epitaxial layers to provide a desired channel region for the FET.

Operation 302 is to form a nitrogen-rich silicon nitride layer, hereinafter the N-rich layer, of a gate dielectric layer on the semiconductor substrate. The N-rich layer may formed at a lower temperature than a stoichiometric silicon nitride layer. A ratio of a flow rate of a nitrogen-containing reagent to a flow rate of a silicon-containing reagent may be higher than for the stoichiometric silicon nitride layer.

Optional operation 304 is to form a silicon-rich silicon nitride layer, hereinafter the Si-rich layer, of the gate dielectric layer on the N-rich layer. The Si-rich layer may be formed at a temperature similar to the temperature for forming the stoichiometric silicon nitride layer. A ratio of a flow rate of a nitrogen-containing reagent to a flow rate of a silicon-containing reagent may be lower than for the stoichiometric silicon nitride layer.

Optional operation 306 is to form a stoichiometric silicon nitride layer of the gate dielectric layer over the N-rich layer, on the Si-rich layer if present. The stoichiometric silicon nitride layer may be formed using the same nitrogen-containing reagent and silicon-containing reagent as used to form the N-rich layer.

Operation 308 is to form a gate over the gate dielectric layer. The gate may extend past a channel region to provide a field plate functionality.

Figure 4A:
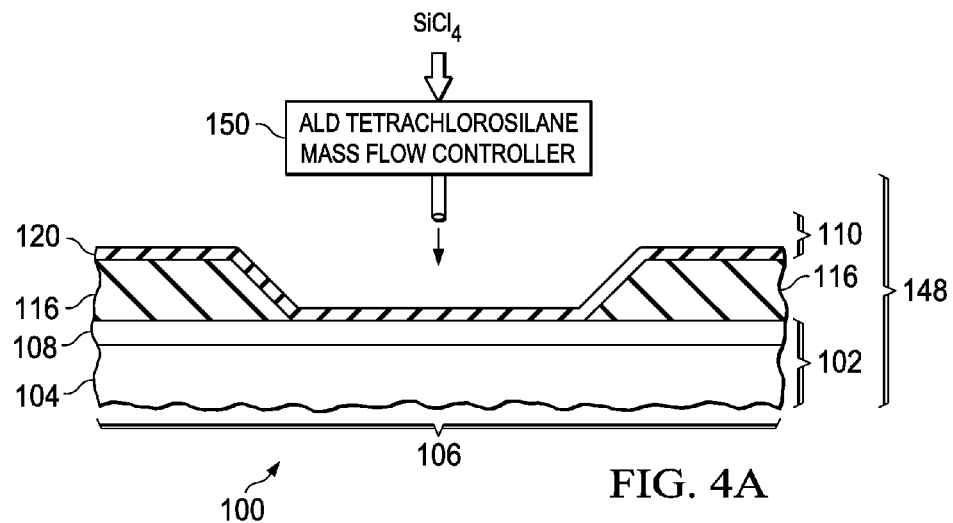
FIG. 4A and FIG. 4B are cross sections of the semiconductor device of FIG. 1, depicting stages of another exemplary method of formation for the N-rich layer.
Figure 4B:
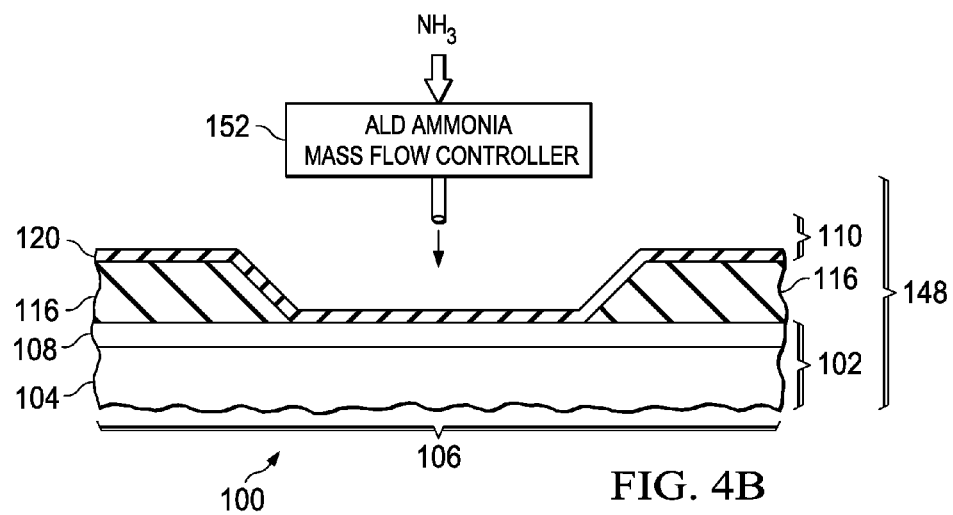

FIG. 4A and FIG. 4B are cross sections of the semiconductor device of FIG. 1, depicting stages of another exemplary method of formation for the N-rich layer. Referring to FIG. 4A, the semiconductor device 100 is placed in an ALD chamber 148, possibly with a plurality of similar substrates. The semiconductor device 100 is heated to a temperature of about 375° C. Tetrachlorosilane is flowed into the first LPCVD chamber, using an ALD tetrachlorosilane flow controller 150, to provide a pressure of about 170 millitorr. Tetrachlorosilane molecules are adsorbed on the semiconductor device 100 to form an adsorbed layer of silicon-containing reagents. Flow of the tetrachlorosilane is discontinued after the adsorbed layer of silicon-containing reagents is formed.

Referring to FIG. 4B, the semiconductor device 100 is heated to a temperature of about 550° C. in the ALD chamber 148. The ALD chamber 148 may encompass two separate deposition regions, held at different temperatures. Ammonia is flowed into the ALD chamber 148 using an ALD ammonia flow controller 152, to provide a pressure in the ALD chamber 148 of about 300 millitorr. Ammonia molecules adsorb on the semiconductor device 100 and react with the adsorbed layer of silicon-containing reagents to form a portion of the N-rich layer 120.

The operations described in reference to FIG. 4A and FIG. 4B are repeated to form the full N-rich layer 120. Depending on a desired thickness of the N-rich layer 120, the operations described in reference to FIG. 4A and FIG. 4B may repeated, for example, 30 times to 120 times. After the full N-rich layer 120 is formed, formation of the semiconductor device 100 may proceed, for example as disclosed in reference to FIG. 2B through FIG. 2E.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A method, comprising:
providing a substrate of a semiconductor device, the substrate comprising a semiconductor material;
forming a nitrogen-rich silicon nitride layer over the substrate in an area for a FET;
forming a silicon nitride layer over the nitrogen-rich silicon nitride layer; and
forming a gate of the FET over the silicon nitride layer, wherein the forming the silicon nitride layer over the nitrogen-rich silicon nitride layer is performed in an ambient that is substantially free of any oxidizing reagent after the nitrogen-rich silicon nitride layer is formed and until the silicon nitride layer is formed.

2. The method of claim 1, wherein the nitrogen-rich silicon nitride layer is formed by a low pressure chemical vapor deposition (LPCVD) process in a first LPCVD chamber using dichlorosilane and ammonia.

3. The method of claim 2, wherein the ammonia is flowed into the first LPCVD chamber at a flow rate of 6 to 12 times a flow rate of the dichlorosilane during formation of the nitrogen-rich silicon nitride layer.

4. The method of claim 2, wherein a temperature of the substrate in the first LPCVD chamber is 600° C. to 740° C. during formation of the nitrogen-rich silicon nitride layer.

5. The method of claim 2, wherein forming the silicon nitride layer over the nitrogen-rich silicon nitride layer comprises forming a silicon-rich silicon nitride layer on the nitrogen-rich silicon nitride layer.

6. The method of claim 5, wherein the silicon-rich silicon nitride layer is formed by an LPCVD process in a second LPCVD chamber using dichlorosilane and ammonia.

7. The method of claim 6, wherein the second LPCVD chamber is the first LPCVD chamber.

8. The method of claim 6, wherein the ammonia is flowed into the second LPCVD chamber at a flow rate of 3 to 6 times a flow rate of the dichlorosilane during formation of the silicon-rich silicon nitride layer.

9. The method of claim 6, wherein a temperature of the substrate in the second LPCVD chamber is 780° C. to 900° C. during formation of the silicon-rich silicon nitride layer.

10. The method of claim 5, wherein a thickness of the silicon-rich silicon nitride layer is 5 nanometers to 20 nanometers.

11. The method of claim 1, wherein the silicon-rich silicon nitride layer has an index of refraction which is 0.025 to 0.040 greater than an index of refraction of stoichiometric silicon nitride material, wherein the index of refraction is determined at a wavelength of 630 nanometers to 635 nanometers.

12. The method of claim 1, wherein a thickness of the nitrogen-rich silicon nitride layer is 5 nanometers to 20 nanometers.

13. The method of claim 1, wherein the nitrogen-rich silicon nitride layer has an index of refraction which is 0.015 to 0.030 less than an index of refraction of stoichiometric silicon nitride material, wherein the index of refraction is determined at a wavelength of 630 nanometers to 635 nanometers.

14. The method of claim 1, wherein forming the silicon nitride layer over the nitrogen-rich silicon nitride layer comprises forming a stoichiometric silicon nitride layer on the nitrogen-rich silicon nitride layer, wherein the stoichiometric silicon nitride layer has a silicon-to-nitrogen atomic ratio of about 0.75.

15. The method of claim 1, wherein the nitrogen-rich silicon nitride layer is formed by an atomic layer deposition (ALD) process in an ALD chamber using tetrachlorosilane and ammonia.

16. The method of claim 15, wherein the ALD process comprises:
heating the substrate to a temperature of about 375° C. in the ALD chamber;
flowing the tetrachlorosilane into the ALD chamber to provide a pressure of about 170 millitorr while the substrate is at the temperature of about 375° C.;
subsequently discontinuing the tetrachlorosilane into the ALD chamber;
subsequently heating the substrate to a temperature of about 550° C. in the ALD chamber;
flowing the ammonia into the ALD chamber to provide a pressure of about 300 millitorr while the substrate is at the temperature of about 550° C.; and
subsequently discontinuing the ammonia into the ALD chamber.

* * * * *